United States Patent
Obeng et al.

(10) Patent No.: US 7,700,481 B2
(45) Date of Patent: Apr. 20, 2010

(54) METHOD FOR RELIABLY REMOVING EXCESS METAL DURING METAL SILICIDE FORMATION

(75) Inventors: Yaw S. Obeng, Frisco, TX (US); Murlidhar Bashyam, Richardson, TX (US); Srinivasa Raghavan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 11/767,723

(22) Filed: Jun. 25, 2007

(65) Prior Publication Data
US 2008/0315322 A1 Dec. 25, 2008

(51) Int. Cl.
*H01L 21/44* (2006.01)
(52) U.S. Cl. .................. 438/652; 438/592; 438/682; 438/686; 438/655
(58) Field of Classification Search .............. 438/197, 438/592, 585, 652, 655–657, 682, 686
See application file for complete search history.

(56) References Cited

U.S. PATENT DOCUMENTS

| 6,337,272 | B1 * | 1/2002 | Hamanaka | 438/651 |
| 7,390,729 | B2 * | 6/2008 | Hsieh et al. | 438/583 |
| 7,435,672 | B2 * | 10/2008 | Yue et al. | 438/592 |

\* cited by examiner

*Primary Examiner*—Matthew Smith
*Assistant Examiner*—Wilner Jean Baptiste
(74) *Attorney, Agent, or Firm*—Warren L. Franz; Wade J. Brady, III; Frederick J. Telecky, Jr.

(57) ABSTRACT

A method for manufacturing a semiconductor device. The method comprises forming a metal layer on a silicon-containing layer located on a semiconductor substrate. The method also comprises reacting a portion of the metal layer with the silicon-containing layer to form a metal silicide layer. The method further comprises removing an unreacted portion of the metal layer on the metal silicide layer by a removal process. The removal process includes delivering a flow of an acidic solution to a surface of the unreacted portion of the metal layer, wherein the acidic solution delivered to the surface is substantially gas-free.

11 Claims, 6 Drawing Sheets

METHOD FOR RELIABLY REMOVING EXCESS METAL DURING METAL SILICIDE FORMATION

TECHNICAL FIELD

The disclosure is directed, in general, to a method of manufacturing a semiconductor device, and more specifically, to a method of manufacturing a semiconductor device having a metal silicide layer, and to semiconductor devices manufactured therefrom.

BACKGROUND

Semiconductor devices, such as n-type metal oxide semiconductor (nMOS) or p-type metal oxide semiconductor (pMOS) transistors, can include metal silicide layers. The metal silicide layers can form contact electrodes for source and drain electrodes or for gate electrode.

SUMMARY

The disclosure provides a method for manufacturing a semiconductor device. The method comprises forming a metal layer on a silicon-containing layer located on a semiconductor substrate. The method also comprises reacting a portion of the metal layer with the silicon-containing layer to form a metal silicide layer. The method further comprises removing an unreacted portion of the metal layer on the metal silicide layer by a removal process. The removal process includes delivering a flow of an acidic solution to a surface of the unreacted portion of the metal layer, wherein the acidic solution delivered to the surface is substantially gas-free.

Another embodiment of the method comprises forming one or more transistors on a semiconductor substrate, wherein at least one of the transistors is manufactured by the above described process for forming the metal silicide layer. The metal layer includes nickel and platinum, and the acidic solution includes hydrochloric acid and peroxide. Removing the unreacted portion of the metal layer includes interrupting the flow of acidic solution and venting off gases upon resuming said flow of said acidic solution, wherein the acidic solution is substantially gas-free. The method also includes depositing one or more insulating layers on the semiconductor substrate, wherein the metal silicide layer is covered by the insulating layers. The method further includes forming interconnects through one or more of the insulating layers. The interconnects contact the metal silicide layer to interconnect the at least one transistors to each other, or to other transistors of the semiconductor device.

Another embodiment is a semiconductor device. The device comprises one or more transistors on or in a semiconductor substrate. At least one of the transistors includes a metal silicide layer that is manufactured by the above-described process.

BRIEF DESCRIPTION OF DRAWINGS

The disclosure is described with reference to example embodiments and to accompanying drawings, wherein.

DETAILED DESCRIPTION

The present disclosure benefits from the discovery that the generation of decomposition gases in a metal removing acidic solution can interfere with the removal of unreacted (e.g., excess) portions of a metal layer. Removing the unreacted metal layer is part of a process to form a metal silicide layer of a semiconductor device. Delivering a flow of substantially gas-free acidic solution to the surface of the metal layer enhances the solution's ability to remove the metal layer.

The term substantially gas-free as used herein is defined as less than about 20 volume percent gas, and balance liquid, in the flow of the acid solution delivered to the surface of the unreacted metal layer. E.g., when the flow of the acidic solution is delivered to a container (e.g., a graduated cylinder) at a known flow rate for a known period, the volume of liquid in the container is at least about 80 percent of the flow rate multiplied by the time.

The term acidic solution as used herein is defined as an aqueous solution having one or more acids capable of oxidizing the metal layer, and having one or more chemicals that decompose to form a gas. To oxidize the metal layer, the acid solution also includes at least one component with a reduction potential that is greater than that of the metals of the unreacted portions of the metal layer.

Figure 1:
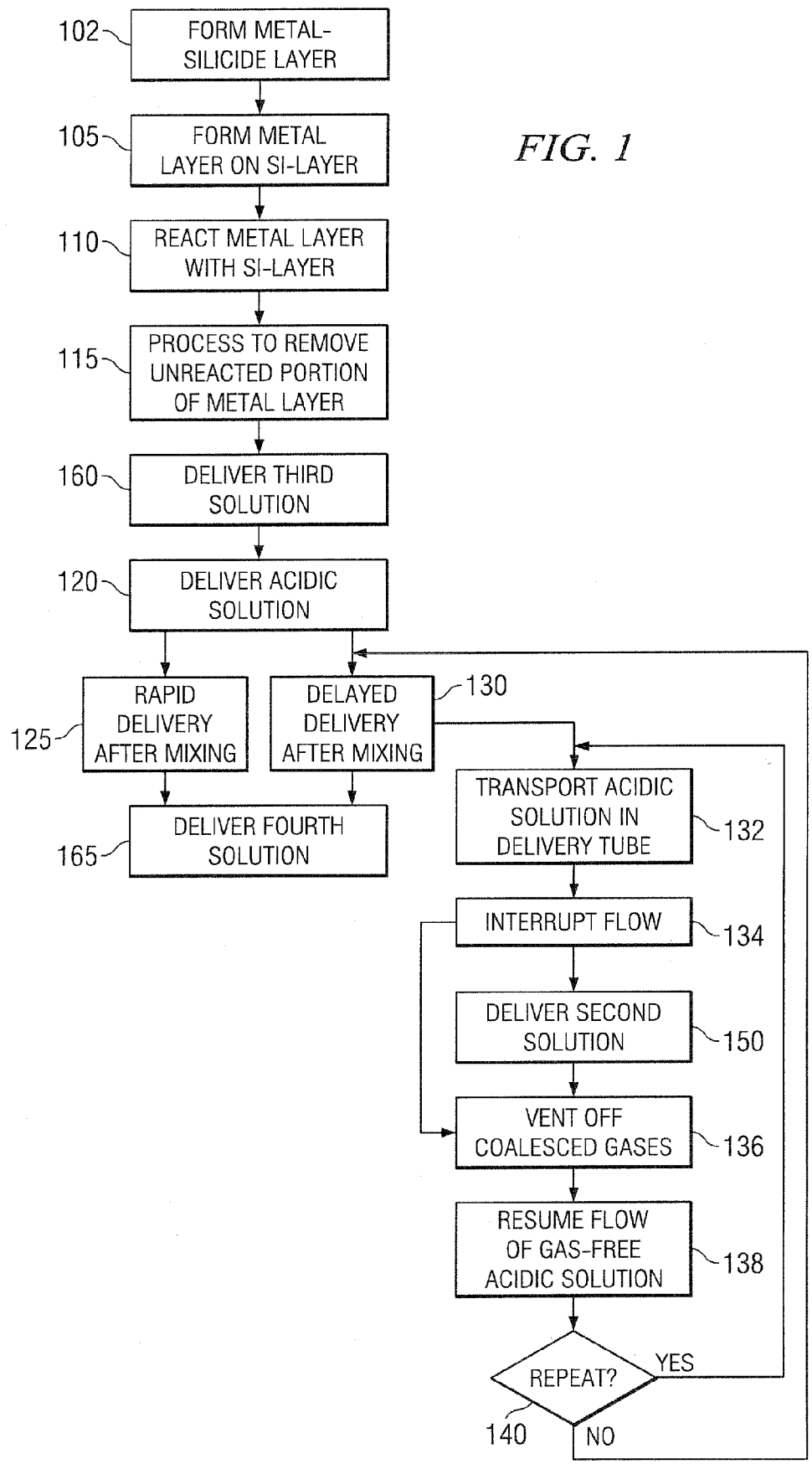
FIG. 1 presents a flow diagram of an example method of manufacturing a semiconductor device that includes the removal processes of the present disclosure.

FIG. 1 presents a flow diagram of an example method of manufacturing a semiconductor device that includes forming a metal silicide layer (step 102) of the present disclosure. In step 105, a metal layer is formed on a silicon-containing layer located on a semiconductor substrate (e.g., a silicon wafer). A physical layer deposition (PVD) process, such as sputtering, or other conventional methods, can be used to deposit the metal layer. The metal layer can include Ni, Ni and Pt, or a NiPt alloy, or other metals suitable for forming a metal silicide layer.

The metal layer can be formed on a silicon-containing layer that includes source and drain regions, a gate electrode, or both. E.g., a silicon-containing layer can include source and drain regions that comprise portions of a silicon substrate selectively doped with dopants. Or, a silicon-containing layer can include source and drain regions that comprise a layer (e.g., SiGe) that is deposited on or in the semiconductor substrate. Or, the silicon-containing layer can include a polysilicon layer of a gate electrode.

Forming the metal layer in step 105 can include forming the metal layers on different silicon-containing layers at different stages in the device's fabrication process. E.g., one metal layer can be formed on a silicon-containing gate electrode first, while the source and drain regions are metalized with a second metal layer later in the process.

In step 110 a portion of the metal layer is reacted with the silicon-containing layer to form the metal silicide layer. Reacting the metal layer with the silicon-containing layer, in step 110, can include heating to anneal the silicon-containing layer and the metal layer. In some embodiments, where the metal layer comprises Ni and Pt, the anneal can include one or more stages of heating to temperatures ranging from about 300° C. to 500° C. for durations of about 15 to 120 seconds. E.g., in some cases reacting includes a first anneal having an uppermost temperature of about 400° C. and a second anneal having an uppermost temperature of about 500° C. Temperatures of about 500° C. or less are desirable because at higher temperature, metals such as Ni can form agglomerations instead of a continuous metal silicide layer. The inclusion of Pt in the metal layer can help make the metal layer less susceptible to forming such agglomerations, in particular at temperatures of about 500° C. E.g., in some embodiments, the metal layer comprises about 95 weight percent Ni and 5 weight percent Pt.

An unreacted portion of the metal layer on the metal silicide layer is removed by a process in step 115. The process 115 includes delivering a flow of an acidic solution to the metal layer's surface (step 120). It is desirable to remove substantially the entire unreacted metal layer so that it will not short circuit the semiconductor device. As noted above, the acidic solution delivered to the metal layer's surface is substantially gas-free. Delivering a substantially gas-free acidic solution is important for the efficient removal of the metal layer. The presence of significant quantities of gases in the acidic solution can interfere with the ability of the acids, and other components of the acidic solution, from making contact with and oxidizing the metal layer. Consequently, the metal layer is removed at a slower than desired rate, and in some cases, the metal layer is not completely removed.

To facilitate the rapid removal of the unreacted metal layer, some embodiments of the acidic solution delivered in step 115 have a pH of about 3, and in some cases, have a pH ranging from about 2 to 1. In some cases, the unreacted portion of the metal layer is removed in step 115 at a rate of about 200 nanometers per minute during exposure to the substantially gas-free acidic solution. E.g., when the metal layer has a thickness of about 100 nanometers, the process 115 removes the metal layer in about 30 seconds or less.

Consider the case where of the metal layer comprises Ni and Pt. Some embodiments of the acidic solution include a mixture of hydrochloric acid and peroxide (e.g., HCl (37 wt %) and $H_2O_2$ (30 wt %) in a ratio of about 1:1, also known as SC2). The peroxide is the component of the SC2 mixture that has a greater reduction potential than the metal layer (e.g., Pt or Ni). In other embodiments, the HCl can be replaced with, or further include, one or more of hydrogen bromide (HBr) and hydrogen iodide (HI). In still other embodiments, the acidic solution can include aqua regia, a mixture of HCl and nitric acid ($HNO_3$ 50 wt %) (e.g., $HCl:HNO_3$ 1:1 to 5:1). The nitric acid is the molecular species of aqua regia that has a greater reduction potential than the metal layer. In yet other embodiments, the acidic solution that includes a mixture of sulfuric acid and peroxide (e.g., $H_2SO_4$ and $H_2O_2$, also known as SPM or piranha mix). Some embodiments of the SPM mix comprise $H_2SO_4$ and $H_2O_2$ (100wt %):$H_2O_2$ (30 wt %) in ratios ranging from about 1:4 to 4:1.

It is preferable for the acidic solution to include anions capable of forming water-soluble metal coordination complexes by ligating the metal atoms of the metal layer. The formation of such complexes facilitates the removal of unreacted metal layer. E.g., acidic solutions that include one or more of HCl, HBr or HI have anions ($Cl^-$, $Br^-$ and $I^-$, respectively) that can form such complexes with Pt ($PtCl_4$, $PtBr_4$, $PtI_4$, respectively). Similar complexes can be formed with Ni or other metals.

In some cases to achieve the delivery of a substantially gas-free acidic solution, the process 115 includes delivering, in step 120, the acidic solution to the metal layer's surface before substantial quantities of decomposition gases are generated (step 125). E.g., consider the case where decomposition gases of oxygen ($O_2$) from embodiments of the SC2 mixture form on the order of about 1 minute or longer. In such instances, rapidly mixing HCl and $H_2O_2$ and delivering the SC1 mixture, e.g., in less than about 0.5 minutes, allows the delivery of a substantially gas-free acidic solution in accordance with step 125.

In other cases, for reasons of space limitations in storing reagents, or other logistical considerations, the formation of the metal silicide layer is performed using a fabrication tool that does not allow the rapid mixing and delivery of the acidic solution. In such cases, the process 115 includes mixing the components of the acidic solution in a location that is remote from the semiconductor substrate (step 130). The acidic solution is then transported through a delivery tube to the semiconductor substrate (step 132). In such cases, the acidic solution resides in the delivery tube for a period sufficient to generate decomposition gases that become incorporated as entrained gas bubbles into the flow of the acidic solution as foam.

E.g., consider the case where the acidic solution includes the SC2 mixture and the decomposition gas is $O_2$. In such instances, significant qualities of $O_2$ gas {e.g., about 20 percent or more of the total volume of the acidic solution delivered to the substrate} can be generated from about 1 to 10 minutes while the acidic solution resides in the delivery tube.

The timescale and the type of decomposition gas generated after the remote mixing step 130 depends upon numerous factors, such as the composition of the acidic solution, the acidic solution's temperature and viscosity. E.g., when the acidic solution comprises aqua regia, the decomposition gas generated includes nitrogen dioxide ($NO_2$). E.g., when the acidic solution comprises concentrated sulfuric acid, the high viscosity of $H_2SO_4$ (e.g., viscosity of about 27 mPa·s at 20° C.) helps deter the formation of the decomposition gases (e.g., gas bubbles) in the solutiont's flow, as compared to an acidic solution comprising HCl.

In cases where substantial amounts of decomposition gases are generated in the delivery tube during the transporting step 132, the removal process 115 includes interrupting the flow (step 134) and venting off gases (step 136) (e.g., coalesced gases of the entrained decomposition gases) upon resuming the flow of the acidic solution, wherein the acidic solution is substantially gas-free. Interrupting the acidic solution's flow in step 134, is for a period sufficient for gas bubbles entrained in the acidic solution to coalesce. The coalesced gas bubbles are at least about 10 times larger than the entrained gas bubbles generated when the components of the acidic solution are mixed together and passed through the delivery tube. After the interruption step 134, the coalesced gases are vented off in step 136, and the flow is resumed in step 138. In some cases, venting off the coalesced gases in step 136 and resuming the flow in step 138 occur simultaneously. In some embodiments an acidic solution comprising SC2 is delivered at a flow rate of about 0.01 to 1 liters per minute. In such embodiments, the period for the entrained gas bubbles to coalesce during the interrupted flow (step 134) is at least about 0.25 minutes, and in some cases ranges from about 1 to 4 minutes. Although longer interruption periods could be used, this could undesirably lengthen the total time used for the removal process step 120. When flow is resumed in step 138, coalesced gases that have built up at the head of the delivery tube vent out of the tube in step 136 for about 0.25 to 0.5 minutes, followed by the delivery of the substantially gas-free acidic solution to the metal layer's surface. In other cases, however, a separate valve in the delivery tube is opened so that the coalesced gases are vented out of the tube in step 136, and then the flow is resumed in step 138.

The resumption of flow in step 138 is limited to a period that is shorter than the time needed for significant quantities of decomposition gases to regenerate and be entrained in the acidic solution's flow. E.g., when an acidic solution comprising SC2 is delivered at a flow rate of about 0.5 to 1 liters per minute, the resumption of flow in step 138 is about 2 minutes or less and in some cases ranges from about 1.5 to 2 minutes.

As signified by decision step 140, to ensure that the metal layer is completely removed, the removal process step 115 can include repeatedly interrupting the acidic solution's flow. E.g., the flow of the acidic solution of step 132 is interrupted for a period sufficient for the entrained gas bubbles to coalesce and be vented off in accordance with steps 134 and 136, and then restarting the flow in steps 138. In some embodiments, the removal process step 115 includes repeating steps 132-138 for 2 to 4 cycles.

In some embodiments, during the interruption in flow (step 134), no solution is delivered to the metal layer. In other cases, however, during the interruption (step 134), it is desirable to keep the metal layer's surface wet. Preventing the metal layer's surface from drying out is desirable because this prevents the formation of dry oxides or other precipitates. Such precipitates can be difficult to rehydrate and re-suspend in solution. These precipitates can form a film on the unreacted metal layer's surface thereby blocking the metal layer removal process.

In some cases, therefore, during the interruption in flow (step 134) one or more second solutions (that is, a solution other than the acidic solution) are delivered to the metal layer's surface in step 150. E.g., when the acidic solution comprises SC2, then the second solution can be water, or a second acidic solution. The second acidic solution can be a second SC2 mixture, the SPM mixture, aqua regia, or a sequential series of two or more such second solutions. E.g., during the interruption in flow (step 134) there can be a delivery of a second solution that includes a flow of water, followed by a flow of SPM, to the metal layer surface, followed by a second flow of water.

In some embodiments, it is desirable for the second solution to include a second acidic solution because it can facilitate the removal of the metal layer. In some cases, however, the second acidic solution may generate its own decomposition gases while being transported in a second delivery tube to the metal layer. In such cases, it is desirable to interrupt the second acidic solution's flow to allow its decomposition gas to coalesce and be vented off, similar to that described above in the context of steps 134-138.

In some embodiments, the removal process includes a step 160 of delivering one or more third solutions to the surface before the flow of the acidic solution (step 132). Some embodiments of the third solution can be a non-acidic solution (e.g., a pH of about 7 or greater). E.g., the third solution can include a mixture of peroxide and water ($H_2O_2:H_2O$, about 1:1) at room temperature to pre-wet the metal layer's surface before treating it with the acidic solution. E.g., the third solution can also include treatment with a mixture ammonium hydroxide and peroxide (e.g., $NH_4OH:H_2O_2$, 1:3 to 1:4, also known as SC1) at about 65° C. E.g., the third solution can further include treatment with water at about 40 to 100° C.

Some embodiments of the metal layer include a diffusion barrier layer (e.g., titanium nitride, TiN). Removal of the TiN barrier layer is important because some embodiments of the acidic solution (e.g., the SC2 solution) do not efficiently remove the TiN layer. Consequently, such an acidic solution cannot remove the remaining portions of the unreacted metal layer. Treating the metal layer's surface with the SC1 solution facilitates the selective removal of the diffusion barrier on the metal layer before reacting the remaining portions of the metal layer with the silicon-containing layer. In other cases, however, the $NH_4OH$ and $H_2O_2$ mixture is not needed, because other embodiments of the acidic solution or second solution (e.g., the SPM mixture) can readily remove the TiN barrier layer. In cases where the third solution includes treating the metal layer's surface with the $SC_1$ solution, it is desirable to treat the metal layer with a third solution of water, before commencing treatment with the acidic solution. Treating the metal layer with water after the SC1 treatment helps to remove ionic species that could form water insoluble salts with the acidic solution.

In some embodiments, the removal process includes a step 165 of delivering one or more fourth solutions to the surface after the flow of the acidic solution (step 132). Some embodiments of the fourth solution are non-acidic. E.g., in some cases, after delivering the acidic solution (step 132) or a second acidic solution (step 150), the metal silicide layer is exposed to a fourth solution of the SC1 mixture. The SC1 mixture renders the metal silicide surface hydrophilic, so that precipitates are not left on the metal silicide surface after subsequent treatment with a fourth solution of water.

FIGS. 2-7 show cross-sectional views, at various stages of manufacture, of an example semiconductor device 200 according to the principles of the present disclosure. With continuing reference to FIG. 1, FIGS. 2-6 shows selected stages in the manufacture of the device 200 that includes forming a metal silicide layer in accordance with step 102. In some cases, manufacturing the device 200 includes a forming one or more transistors 202 on a semiconductor substrate 205, where at least one of the transistors 202 is manufactured by a process that includes forming the metal silicide layer. The transistor 202 can be configured as a metal oxide semiconductor (MOS) transistor, such as a pMOS or an nMOS transistor.

Figure 2:
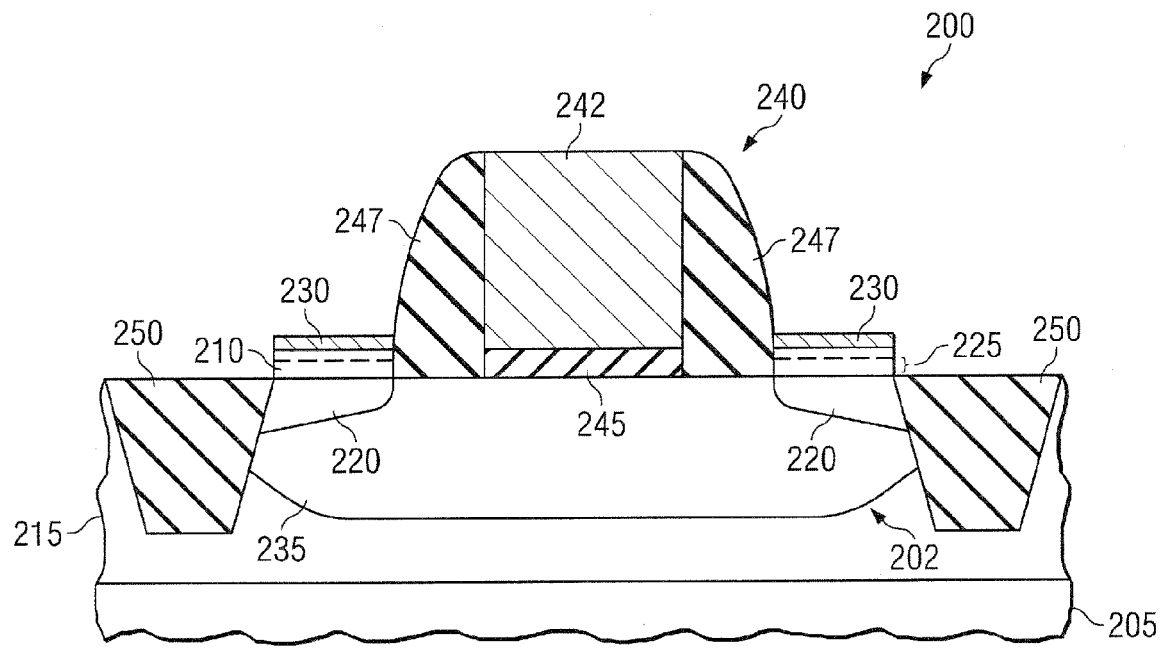
FIGS. 2-7 show cross-section views, at various stages of manufacture, of an example semiconductor device according to the principles of the present disclosure.

FIG. 2 shows the device 200 after forming a metal layer 210 on a silicon-containing layer 215 that is located on the semiconductor substrate 205, in accordance with step 105. E.g., the silicon-containing layer 215 can be a silicon layer of a silicon-on-insulator substrate, a silicon-germanium layer, or a silicon wafer substrate. The metal layer 210 can include Ni and Pt. For the example embodiment shown in FIG. 2, the silicon-containing layer 215 includes source and drain regions 220 of a silicon substrate 205. At least a portion 225 of the metal layer is configured to be reacted with the silicon-containing layer 215. As also shown in FIG. 2, the metal layer 210 can include a diffusion barrier layer 230 (e.g., TiN barrier layer). As further illustrated in FIG. 2, the transistor 202 can further include a doped well 235 and gate structure 240, including a gate electrode 242 (e.g., a polysilicon gate electrode), gate dielectric layer 245 (e.g., silicon oxide dielectric layer), and gate sidewalls 247 (e.g., silicon nitride and silicon oxide sidewalls). The device 200 can include shallow trench isolation structures 250 that comprise insulating materials such as silicon oxide or silicon nitride.

Figure 3:
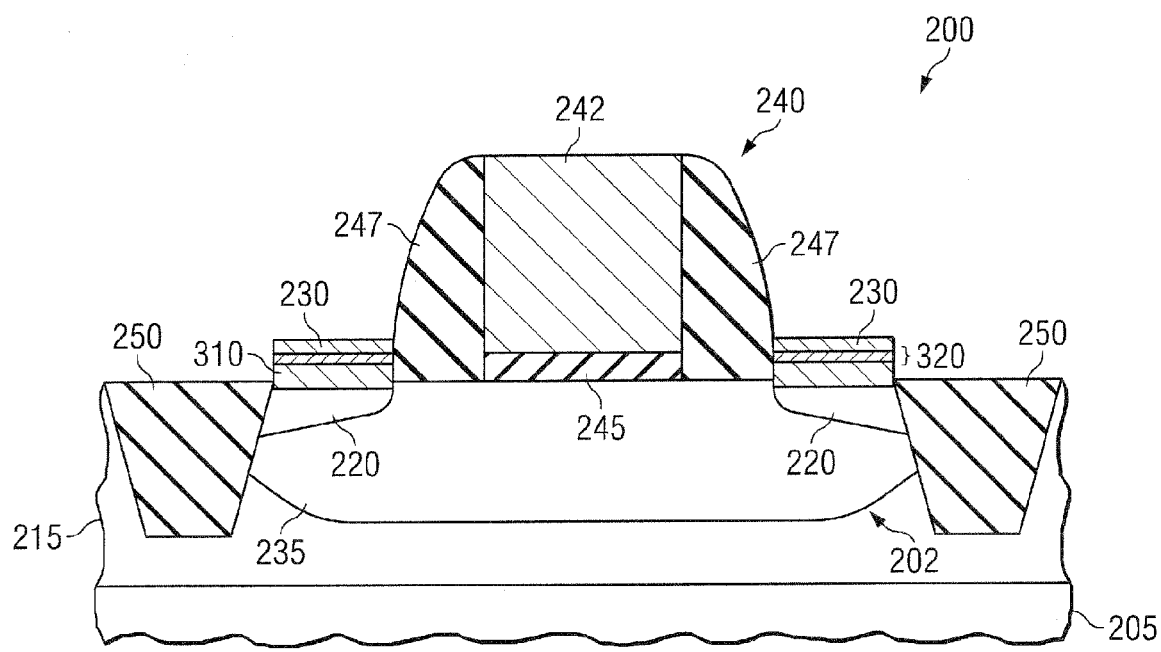

FIG. 3 shows the device 200 after reacting the portion 225 of the metal layer 210 (FIG. 2) with the silicon-containing layer 215 of the transistors 202 to form a metal silicide layer 310 in accordance with step 110. Some embodiments of the metal silicide layer 310 comprise Ni, Pt and Si. For the embodiment shown in FIG. 3, the metal silicide layer 310 is configured as a contact electrode for the source and drain regions 220. In other embodiments, the metal silicide layer can be configured as a contact electrode for the gate electrode 242. As illustrated in FIG. 3, not all of the metal layer 210 is reacted with the silicon-containing layer 215. Rather, there is a remaining unreacted portion 320 of the metal layer 210 (FIG. 2) located on the metal silicide layer 310.

Figure 4:
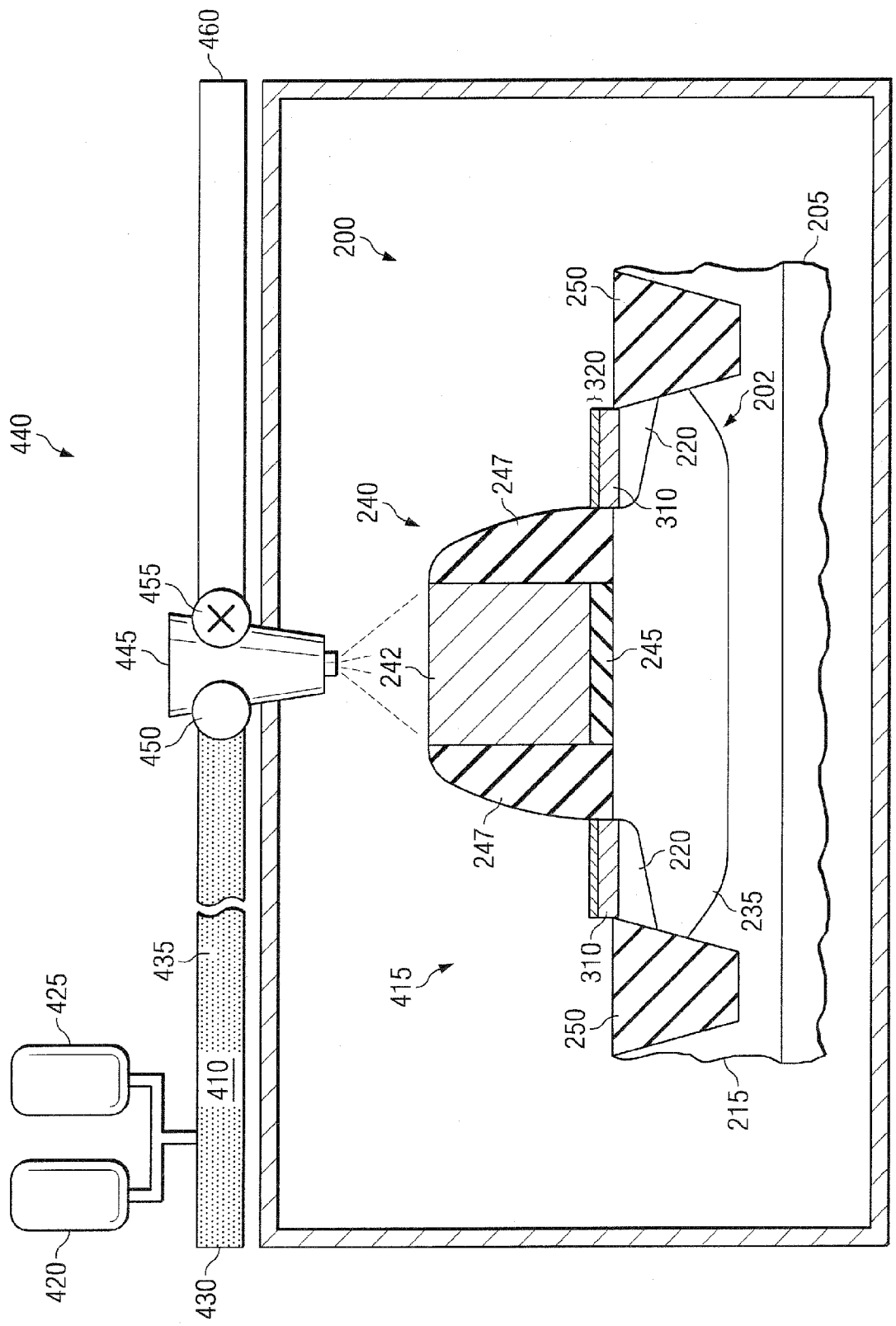
Figure 5:
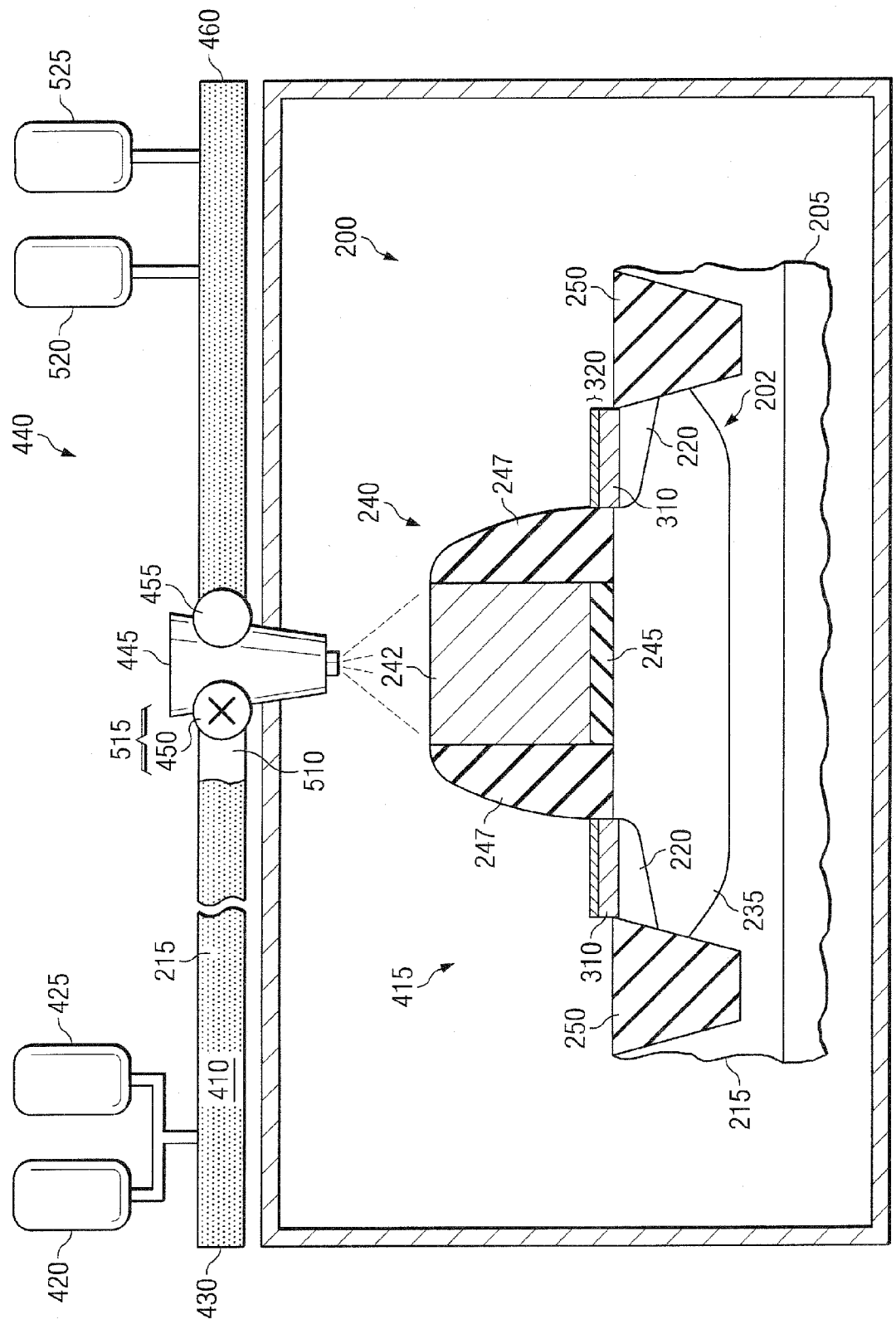
Figure 6:
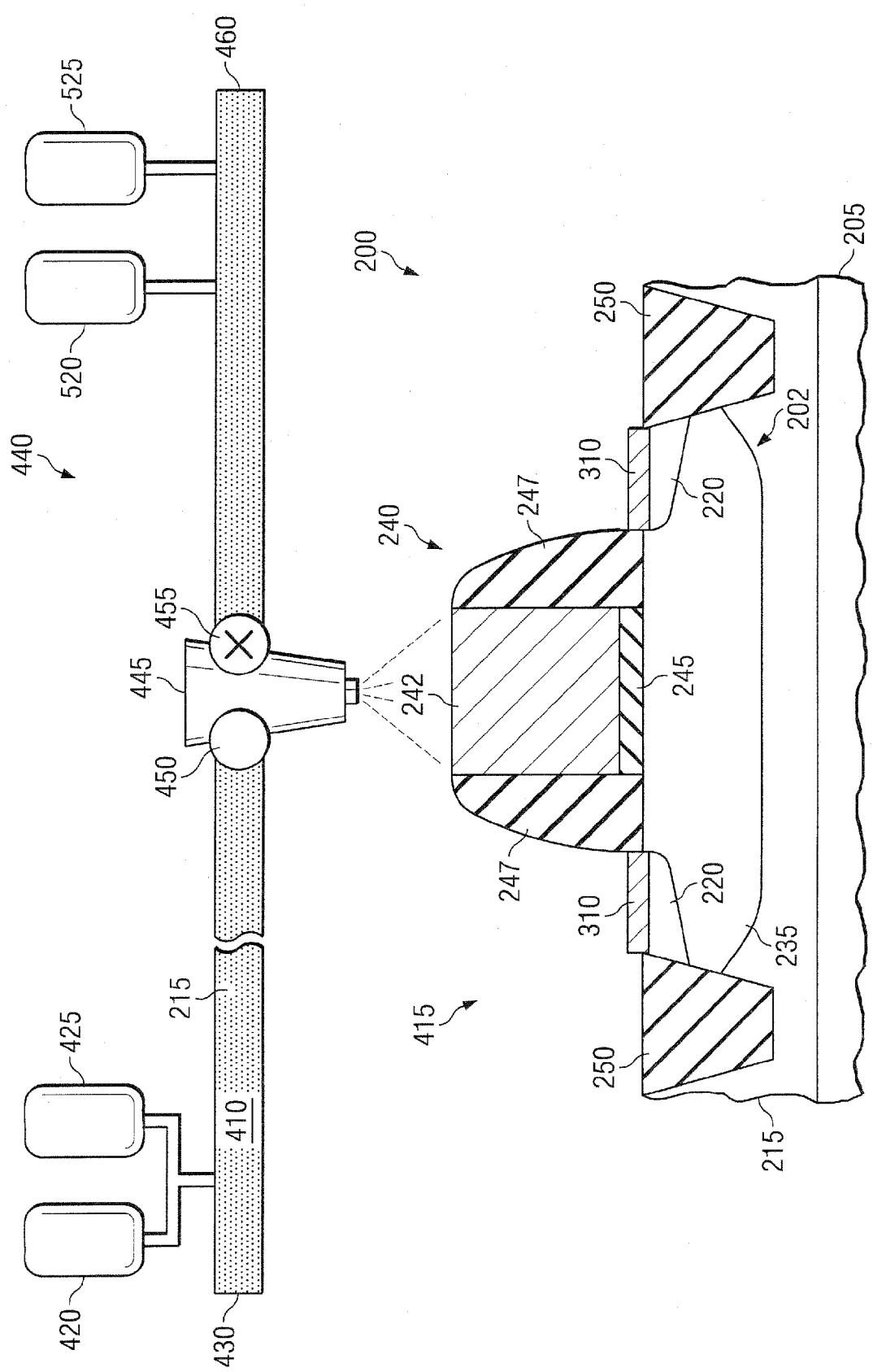

FIGS. 4-6 show the device 200 at selected stages in removing the unreacted portion 320 of the metal layer 210 (FIG. 2) on the metal silicide layer 310 by a process in accordance with step 115. FIG. 4 illustrates the device 200 while delivering a flow of an acidic solution 410 including hydrochloric acid and peroxide (e.g., the SC2 mixture) to a surface 415 of the unreacted portion 320 of the metal layer 210 (step 120). The device is shown after removing the barrier layer 230 (FIG. 3), e.g., using the SC1 solution, discussed above in the context of FIG. 1.

The example embodiment shown in FIG. 4 illustrates that the components (e.g., a hydrochloric acid solution 420 and peroxide solution 425) of the acidic solution 410 can be mixed at a location remote from the semiconductor substrate 205 (step 130). The acidic solution 410 can be transported through a delivery tube 430 to the substrate 205 (step 132). The acidic solution 410 resides in the tube 430 for a period that is long enough to generate decomposition gases 435 which become entrained in the flow of the acidic solution 410. The delivery tube 430 can be a component of a fabrication tool 440 configured to perform metal layer removal. As illustrated in FIG. 4, the delivery tube 430 can be coupled to a spray port 445 and valve 450 of the tool 440. The spray port 445 facilitates the uniform delivery of the acid solution 410 to the metal layer surface 415. The valve 450 controls the flow rate of the acidic solution 410. The tool 440 can include other components such as a second valve 455 and second delivery tube 460 coupled to the spray port 445.

FIG. 5 illustrates the device 200 after interrupting the flow for a period sufficient for decomposition gases 435 (FIG. 4) entrained in the acidic solution's 410 flow to coalesce (step 134). For the embodiment illustrated in FIG. 5, the coalesced gas 510 can accumulate at an end 515 of the delivery tube 430. As further illustrated in FIG. 5, during the interruption period, one or more second solutions 520, 525 can be delivered to the metal layer's 210 surface 415 (step 150) via the second delivery tube 460. In some embodiments, the second solution includes separate sequential flows of water 520, a flow of a second acidic solution 525 (e.g., comprising the SPM mixture) and a second flow of the water 520. As shown in FIG. 5 the delivery of the second solutions can be controlled with the valve 455.

FIG. 6 shows the device 200 after resuming the flow of the acidic solution 410 (step 138) and venting off the coalesced gases 510 (FIG. 5). Consequently, the acidic solution 410 delivered to the metal layer's surface 415 is substantially gas free.

As discussed in the context of FIG. 1, the removal process such as presented in FIGS. 4-6 can be repeated in accordance with step 140 to facilitate the complete removal of the metal layer's unreacted portion 320 (FIG. 3). E.g., in some embodiments, the removal process (step 115) can include providing a first flow of the acidic solution 410 (e.g., the SC2 mixture), followed by a first interruption of the acidic solution's flow for a first period. During the first interruption period there can be a sequential flow of water 520, a flow of a second acidic solution 525 comprising the SPM mixture (step 150), and a second flow of water 520. Next, a second flow of the acidic solution 410 is resumed, followed by a second interruption for a second period. During the second interruption period, there is a third flow of water 520, a second flow of the second acidic solution 525 and a fourth flow of water 520. A third flow of the acidic solution 410 is then resumed, followed by a final third interruption period, during which time there is a fifth flow of water 520. In some cases the both the first, second and third flows of the acidic solution 410 are for times of about 1 to 2 minutes, and the first and second interruption periods are about 8 to 9 minutes. The flow of water 520 and the second acidic solution 525 during the first and second interruption periods can range from 1 to 3 minutes.

Figure 7:
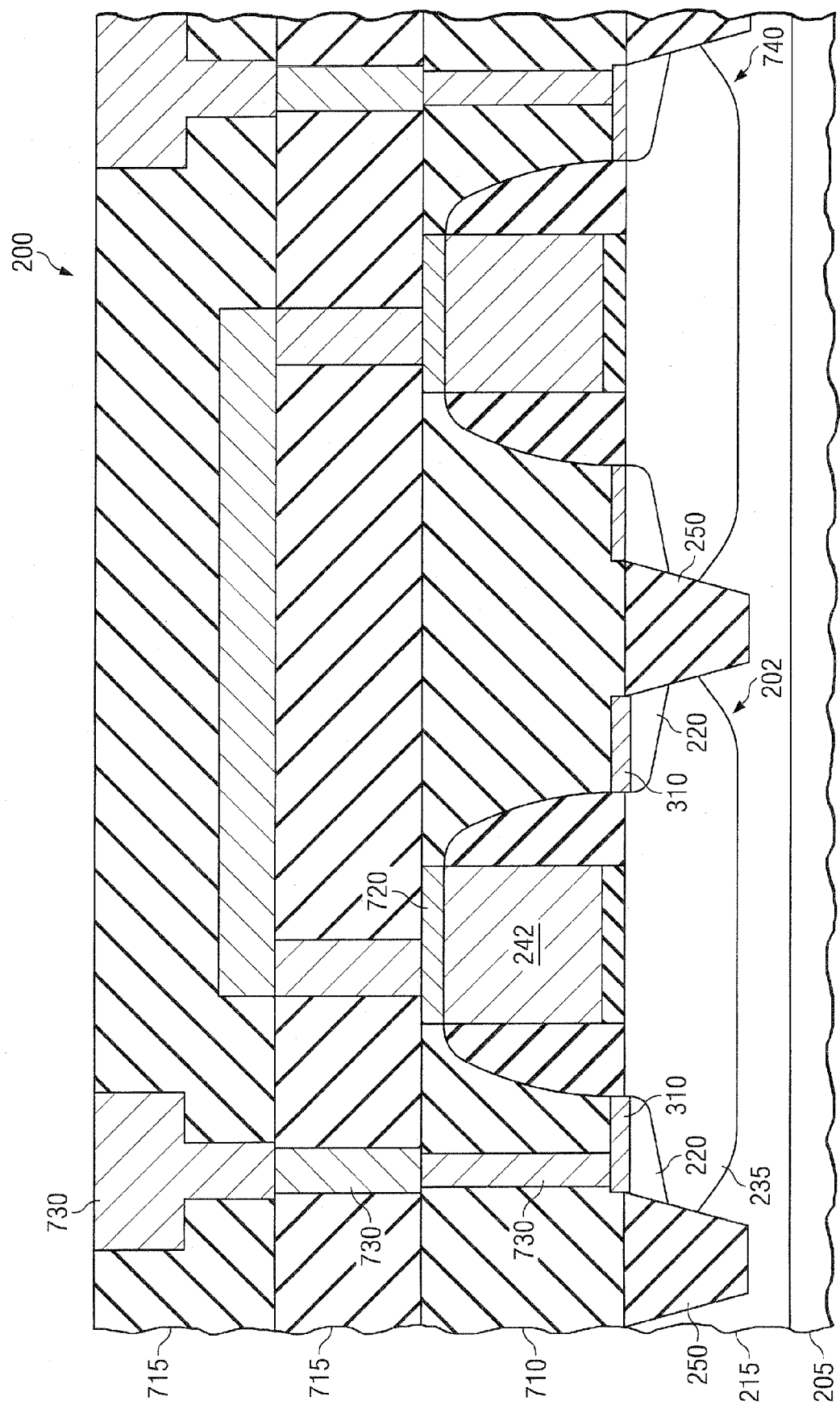

FIG. 7 shows the device 200 after depositing one or more insulating layers 710, 715 on the substrate 205. The metal silicide layer 310 is covered by the insulating layers 710, 715. E.g., one insulating layer 710 can be pre-metal dielectric layer while other layers 715 are interlayer dielectric (ILD) layers. The layers 710, 715 can comprise silicon dioxide, tetraethyl orthosilicate, or high-k dielectric materials well known to those skilled in the art.

FIG. 7 also shows the device 200 after forming another metal silicide layer 720 on the gate electrode 242. A process analogous to that described in the context of FIGS. 2-6 can be used to form the metal silicide layer 720 on the gate electrode 242. The metal silicide layer 720 can comprise the same or different materials as the metal silicide layer 310 on the source and drain regions 220.

FIG. 7 further shows the device 200 after forming interconnects 730 (e.g., single or dual damascene structures) through one or more of the insulating layers 710, 715. The interconnects 730 contact the metal silicide layers 310, 720, to interconnect the similarly fabricated transistors 202 to each other, or to other transistors 740 of the semiconductor device 200.

FIG. 7 also illustrates another embodiment of the disclosure, a semiconductor device 200. In some embodiments, the semiconductor device 200 is, or includes, an integrated circuit. The device 200 comprises one or more transistors 202 on or in a semiconductor substrate 205. At least one of the transistors 202 includes a metal silicide layer 310 that is manufactured by the above-described process. That is, any of processes described above in the context of FIGS. 1-7 can be used to form the metal silicide layer 310. E.g., in some embodiments, the metal silicide layer 310 is configured as an electrode contact for source and drain regions 220 or a gate electrode 242 of the transistor 202. In such cases the metal silicide layer 310 can form a self-aligned metal salicide contact.

Those skilled in the art to which the disclosure relates will appreciate that other and further additions, deletions, substitutions, and modifications may be made to the described example embodiments, without departing from the disclosure.

What is claimed is:

1. A method of manufacturing a semiconductor device, comprising:
    forming a metal layer on a semiconductor substrate, the metal layer comprising nickel, nickel and platinum, or a nickel platinum alloy;
    reacting the metal layer with silicon on the substrate to form a metal silicide; and
    removing an unreacted portion of the metal layer by flowing an acidic solution to the metal layer comprising a mixture of a peroxide and an acid comprising hydrochloric acid, sulphuric acid or aqua regia;
    wherein the removing step comprises flowing the acidic solution in a discontinuous flow, interrupting the flow at periodic intervals to permit decomposition oxygen gas bubbles entrained in the flowed solution to coalesce and vent off; thereby reducing the effect of the gas bubbles to impede acid from fully contacting the unreacted metal layer.

2. The improvement of claim 1, wherein, during the interruptions at the periodic intervals, one or more second solutions are flowed; the one or more second solutions including a first flow of water, a flow of a second acidic solution comprising a mixture of sulfuric acid and peroxide, and a second flow of water.

3. The method of claim 1 wherein the removing step includes:
    providing flowing the acidic solution for a first duration;

following the first duration, interrupting the flowing of the acidic solution for a first period during which a first flow of water is flowed, followed by a first flow of a second acidic solution comprising a mixture of sulfuric acid and peroxide is flowed and then followed by a second flow of water;

following the first period, resuming flowing the acidic solution for a second duration;

following the second duration, interrupting the flowing of the acidic solution for a second period during which a third flow of water is flowed, followed by a second flow of the second acidic solution, and then followed by a fourth flow of water;

following the second period, resuming flowing the acidic solution for a third duration; and following the third duration, interrupting the flowing of the acidic solution for a third period during which a fifth flow of water is flowed.

4. The method of claim 1, wherein flowing the acidic solution further includes transporting the acidic solution to the unreacted metal layer through a delivery tube; and venting the gas bubbles from the delivery tube during the periodic interval interruptions.

5. The method of claim 1, wherein the periodic interval interruptions are for durations of 0.25 to 4 minutes each.

6. The method of claim 1, wherein the reacting step includes heating at a temperature ranging from about 300 to 500° C.

7. In a method of manufacturing a semiconductor device, comprising forming a metal layer on a semiconductor substrate, the metal layer comprising nickel, nickel and platinum, or a nickel platinum alloy; reacting the metal layer with silicon on the substrate to form a metal silicide; and removing an unreacted portion of the metal layer by flowing an acidic solution to the metal layer comprising a mixture of a peroxide and an acid comprising hydrochloric acid, sulphuric acid or aqua regia; the improvement comprising:

flowing the acidic solution in a discontinuous flow, interrupting the flow at periodic intervals to permit decomposition oxygen gas bubbles entrained in the flowed solution to coalesce and vent off; thereby reducing the effect of the gas bubbles to impede acid from fully contacting the unreacted metal layer.

8. The improvement of claim 7, further comprising, during the interruptions at the periodic intervals, flowing a second solution to keep the unreacted portion of the metal layer's surface wet.

9. The improvement of claim 8, wherein the acidic solution comprises hydrogen peroxide and hydrochloric acid in a ratio of about 1:1; and the second solution comprises water or a second acidic solution comprising a mixture of a peroxide and an acid comprising hydrochloric acid, sulphuric acid or aqua regia.

10. The improvement of claim 8, further comprising, during the interruptions at the periodic intervals, stopping the flow of the second solution prior to resuming the flow of the acidic solution, and flowing a third solution comprising a non-acidic solution after stopping the flow of the second solution and prior to resuming the flow of the acidic solution.

11. The improvement of claim 10, wherein the non-acidic solution is a mixture of peroxide and water in a ratio of about 1:1.

* * * * *